United States Patent [19]

Taylor

[11] Patent Number: 4,544,847
[45] Date of Patent: Oct. 1, 1985

[54] MULTI-GAP MAGNETIC IMAGING LENS FOR CHARGED PARTICLE BEAMS

[75] Inventor: Norman J. Taylor, Wenham, Mass.

[73] Assignee: Varian Associates, Inc., Palo Alto, Calif.

[21] Appl. No.: 518,167

[22] Filed: Jul. 28, 1983

[51] Int. Cl.⁴ .............................................. H01J 3/22
[52] U.S. Cl. .............................. 250/396 ML; 250/398
[58] Field of Search ............... 250/492.2, 398, 396 R, 250/396 ML, 310, 311

[56] References Cited

U.S. PATENT DOCUMENTS 4,384,208  5/1983  Tsuno ......................... 250/396 ML
4,393,310  7/1983  Hahn ................................... 250/398
4,400,622  8/1983  Takeuchi et al. ........... 250/396 ML

OTHER PUBLICATIONS

H. C. Chu and E. Munro, *Optik* 61, No. 2, (1982), pp. 121-145.
H. C. Chu and E. Munro, *J. Vac. Sci. Technol.*, 19(4), Nov./Dec. 1981, pp. 1053-1057.
Lischke et al., *Proceedings of the Symposium on Electron and Ion Beam Science and Technology*, 8th Int. Conf., 1978, pp. 160-169.

*Primary Examiner*—Alfred E. Smith
*Assistant Examiner*—Jack I. Berman
*Attorney, Agent, or Firm*—Stanley Z. Cole; William R. McClellan

[57] ABSTRACT

A magnetic lens for imaging and rotation of a charged particle beam includes a pair of focus elements axially spaced along a lens bore through which the beam passes and a rotation element positioned axially between the focus elements. Each of the lens elements includes a polepiece having opposing portions surrounding the lens bore and axially spaced apart to define a circumferential gap, and a winding for energizing the polepiece and the gap. The focus elements are energized by equal and opposite magnetic fields which focus the electron beam without substantial beam rotation. The beam can be rotated, without substantial change in focus or magnification, by varying the magnetic field of the rotation element. The lens is particularly suited for use in a shaped electron beam lithography system.

19 Claims, 12 Drawing Figures

MULTI-GAP MAGNETIC IMAGING LENS FOR CHARGED PARTICLE BEAMS

GOVERNMENT RIGHTS

The Government has rights in this invention pursuant to Contract No. F19628-80-C-0173 awarded by the Department of the Air Force.

BACKGROUND OF THE INVENTION

This invention relates to charged particle beam optics and, more particularly, to an imaging lens which provides the capability to rotate an image without substantially affecting the focus or magnification of the image.

Electron beam exposure systems are used commercially for selectively irradiating a resist coated workpiece, which can be a mask plate or a semiconductor wafer. A finely focused electron beam is deflected over the surface of the workpiece to define a prescribed pattern. The electron beam is controlled in a highly accurate, high speed manner to expose microminiature patterns in the electron resist material. Various approaches have been taken in controlling the electron beam. A small circular spot beam can be raster scanned over the entire surface of the workpiece and turned on or off to produce the desired pattern. Alternatively, the spot beam can be directed to desired pattern areas and scanned over those pattern areas in a vector scanning approach. Either approach is relatively slow, since the area covered by the spot beam at any instant is extremely small.

In another approach, the electron beam is shaped into a rectangle of variable size and shape. The shaped beam can be utilized in a step-and-repeat mode to expose the desired pattern. In a preferred shaped electron beam exposure technique, an elongated rectangular beam, or line beam, is scanned in a direction perpendicular to its long dimension. As the beam is scanned, the length of the line is varied to correspond to the desired pattern. This approach permits patterns of almost any shape to be exposed in a single operation. Shaped beam exposure systems provide generally higher operating speeds than spot beam systems and have gained favor in systems for direct writing on wafers.

In producing a shaped beam, a two-aperture shaping system is frequently employed. An image of a first aperture having two orthogonal edges is focused on a second square aperture by an imaging lens. A shaping deflector dynamically positions the image of the first aperture relative to the second aperture so that the beam passing through the second aperture is shaped to the desired cross-sectional length and width.

Present day microlithography systems require extreme accuracy. Minimum feature sizes are on the order of one micron or less and feature accuracies are usually less than one-tenth micron. Exposure variations must be less than 3%. With the two-aperture beam shaping technique described above, the final beam image is defined by two edges of the first aperture and two edges of the second aperture. Therefore, any rotation of the image of the first aperture relative to the second aperture produces a beam which is trapezoidal rather than rectangular. Image rotation can result from mechanical misalignment of the apertures or from beam rotation introduced by magnetic lenses and deflectors. Furthermore, as the magnetic field of the imaging lens is varied in order to focus the image of the first aperture onto the second aperture, undesired rotation is introduced. Typically, beam rotations have been made by mechanically adjustable apertures which provide the desired rotation but are difficult to use and add complexity to the construction of the electron beam column.

It is desirable to incorporate into the imaging lens the capability of rotating the image of the first aperture by application of an electrical signal. The rotational adjustment of the beam should not substantially change either the focus or the magnification of the image. Conversely, the imaging lens should be capable of focusing the image of the first aperture on the second aperture without rotation. Furthermore, as the beam is positioned by the shaping deflector, the distortion introduced by the imaging lens must be within prescribed limits. Existing magnetic lens cannot meet all of the above requirements. With a single gap lens, the beam is defocused when a rotational variation is made. With a doublet, or two-gap lens, the beam stays in focus as a rotational adjustment is made but the magnification is altered.

It is a general object of the present invention to provide novel magnetic lenses for charged particle beams.

It is another object of the present invention to provide magnetic lenses which can introduce variable beam rotation without substantially changing the focus and magnification of the image.

It is yet another object of the present invention to provide magnetic lenses in which the focus can be varied without substantially changing the beam rotation introduced by the lens.

It is still another object of the present invention to provide magnetic lenses with independently variable focus and rotation adjustments wherein distortion is within prescribed limits.

SUMMARY OF THE INVENTION

According to the present invention, these and other objects and advantages are achieved in a magnetic lens for imaging a charged particle beam. The lens comprises first magnetic means for providing a first focusing magnetic field along the axis of the beam and a second magnetic means spaced along the axis of the beam from the first magnetic means for providing a second focusing magnetic field which has the opposite polarity from the first focusing magnetic field. The first and second focusing magnetic fields are operative, when varied together, to focus the beam without substantial change in beam rotation. The lens further includes third magnetic means positioned along the axis of the beam between the first magnetic means and the second magnetic means for providing a rotation magnetic field which can be varied in order to rotate the beam without substantial change in magnification or focus. Typically, each of the magnetic means includes a magnetic polepiece surrounding a central lens bore and having portions axially spaced apart to define a circumferential gap, and a winding which energizes the polepiece and the gap in response to current from a power source. Typically, the second focusing magnetic field has substantially the same magnitude and spatial distribution as the first focusing magnetic field. The magnetic lens can further include a compensation means associated with the first and second magnetic means and operative to reduce the first and second focusing magnetic fields as the rotation magnetic field is increased.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
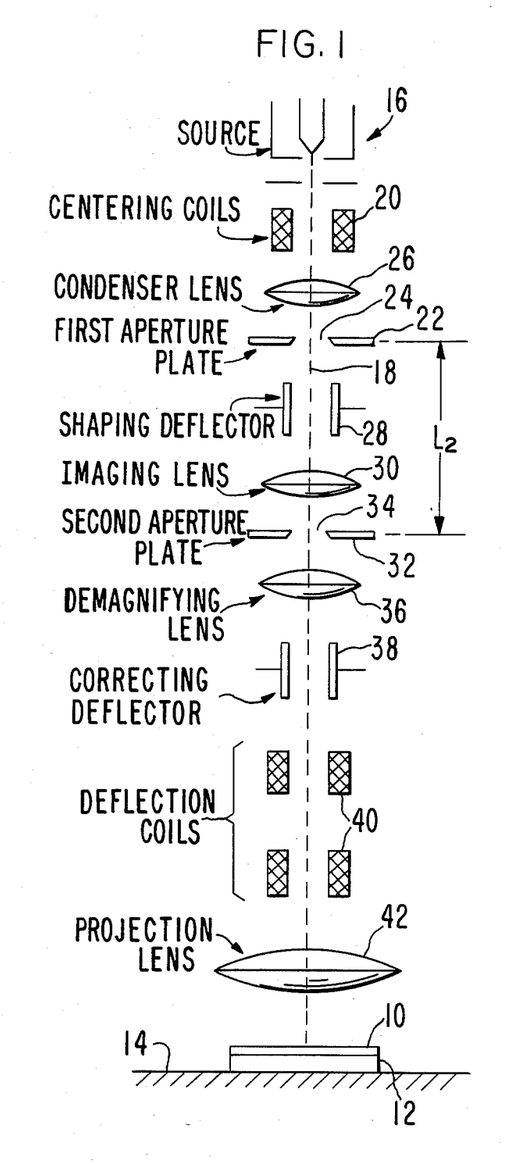
FIG. 1 is a schematic diagram of an electron beam lithography system utilizing beam shaping.

A charged particle beam exposure system for selectively irradiating a workpiece comprising a resist layer 10 on a substrate 12 is shown in schematic form in FIG. 1. The substrate 12 which can be a mask plate or a semiconductor wafer is mounted on a worktable 14, or stage, which is movable in the x and y directions perpendicular to the direction of the charged particle beam. In the present illustrative example, an electron beam is utilized to expose the resist layer 10. A control subsystem (not shown) controls each element of the electron beam column and the movement of the worktable 14 during exposure of a workpiece.

The electron beam column illustrated in FIG. 1 includes an electron source 16 which emits an electron beam 18 along the axis of the column. The electron beam 18 passes through centering coils 20 which precisely align the electron beam with the axis of the column. The beam 18 illuminates a first aperture plate 22 having a first aperture 24 therethrough. A condenser lens 26 focuses the beam 18 to produce an image of the source 16 between the plates of a shaping deflector 28. An imaging lens 30 then focuses an image of the first aperture 24 onto a second aperture plate 32 having a second aperture 34 therethrough. The shaping deflector 28 deflects the image of the first aperture 24 relative to the second aperture 34 to provide a beam cross-section suitable for variable line scanning. In addition, the beam 18 can be blanked off by the shaping deflector 28. The electron beam 18 then passes through a demagnifying lens 36, a correcting deflector 38, deflection coils 40 and a projection lens 42. The demagnifying lens 36 and the projection lens 42 demagnify the beam 18 to its final size and project an image of the shaped beam onto the workpiece. The deflection coils 40 deflect the shaped beam to any specified position within a prescribed scanfield on the workpiece. The correcting deflector 38 provides very high speed electrostatic deflection of the beam 18 over short distances. It will be understood that the region traversed by the electron beam 18 between the source 16 and the workpiece is maintained at high vacuum during processing.

The first aperture 24 can be square or, preferably, L-shaped when the system performs variable line scanning. The second aperture 34 is typically square. The operation of the first aperture 24, the second aperture 34, the imaging lens 30, and the shaping deflector 28 to provide beam shaping and beam blanking is illustrated in FIGS. 2A-2D. The imaging lens 30 focuses a suitably magnified first aperture image on the second aperture 34. Each of the FIGS. 2A-2D depicts the superposition of a first aperture image 50 and the second aperture 34 as viewed along the axis of the electron beam column. The relative positions of the first aperture image 50 and the second aperture 34 are determined by the voltages applied to the shaping deflector 28, typically, an octopole electrostatic deflector. The portion of the electron beam which passes through the second aperture 34 is determined by the amount of overlap between the second aperture 34 and the first aperture image 50 and has a cross-section in the form of an intermediate line 52 of variable length and width and either a vertical or a horizontal orientation, as indicated by the cross-hatched areas in FIGS. 2A-2C. FIG. 2D illustrates the blanking of the beam 18.

Figure 2C:
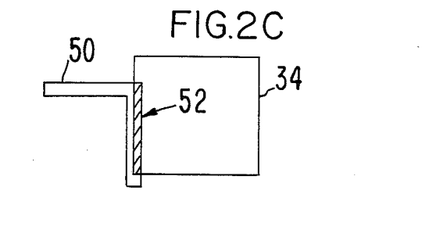
Figure 3:
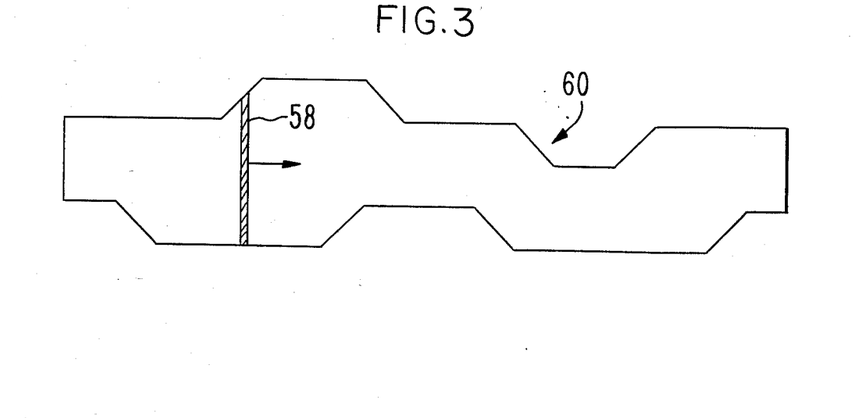
FIG. 3 illustrates the scanning of a pattern by the system of FIG. 1.

An image of the intermediate line 52 is projected by the demagnifying lens 36 and the projection lens 42 onto the surface of the workpiece to provide a projected line 58 at the workpiece as shown in FIG. 3. The exposure of an arbitrarily shaped pattern 60, by scanning of the variable length projected line 58, is illustrated in FIG. 3. Initially, the beam 18 is shaped as illustrated in FIG. 2C and is positioned by the deflection coils 40 at the left edge of the pattern 60. The vertical projected line 58 is then scanned to the right by application of an increasing current to the deflection coils 40. Simultaneously, shaping signals are applied to the shaping deflector 28 and the correcting deflector 38 in order to vary the length and vertical position of the line 58. When the line 58 reaches the right edge of the pattern 60, it is blanked off, and is shifted to the next pattern to be scanned.

Figure 2A:
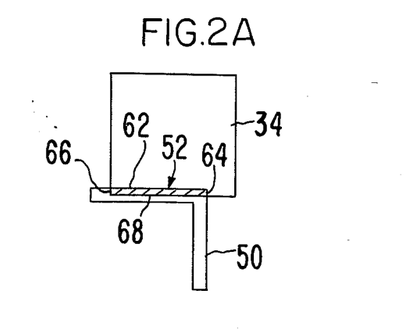
FIGS. 2A-2D illustrate the operation of the system of FIG. 1 in providing a beam cross-section of variable length, width and orientation.
Figure 2B:
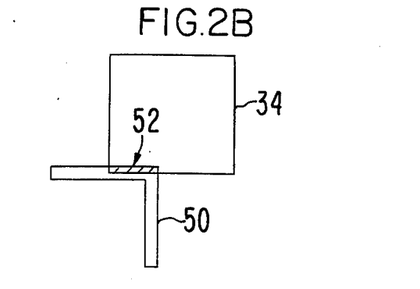
Figure 2D:
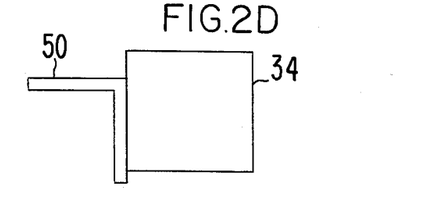

With reference to FIG. 2A, it can be seen that edges 62, 64 of the intermediate line 52 are determined by the aperture 24 while edges 66, 68 are determined by the aperture 34. In order to obtain a rectangular line 52, the edges 62, 68 must be parallel and the edges 64, 66 must be parallel. Any relative rotation between the first aperture image 50 and the second aperture 34 will result in nonparallel edges of the line 52. A distorted intermediate line 52 and, therefore, a distorted projected line 58 will result in nonuniform exposure of pattern features on the workpiece due to width variations in the projected line 58. In accordance with the present invention, there is provided an imaging lens with the capability of rotating the image 50 without substantially altering the focus or magnification of the image 50.

Figure 4:
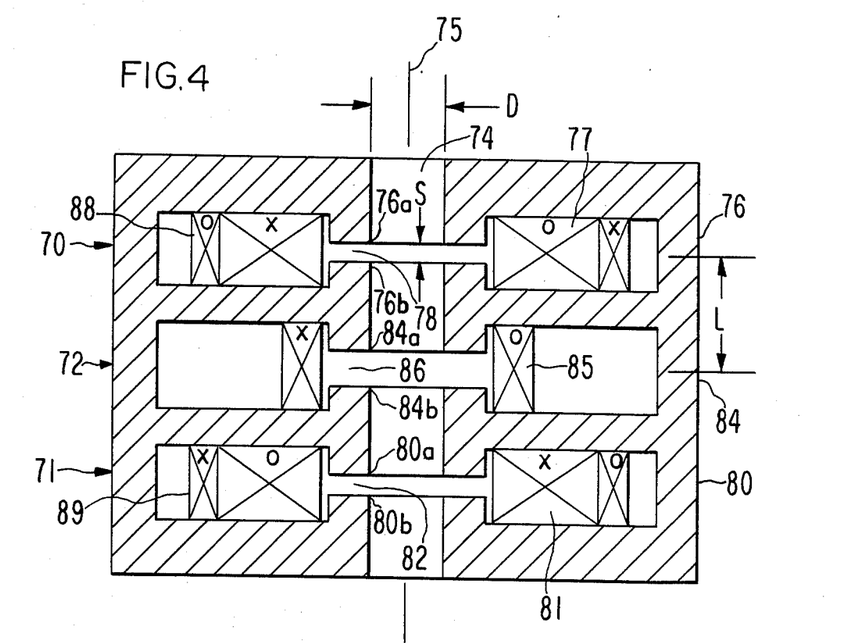
FIG. 4 illustrates a magnetic imaging lens in accordance with the present invention.

Referring now to FIG. 4, there is shown a simplified cross-sectional view of a magnetic lens in accordance with the present invention. The lens shown in FIG. 4 corresponds to the imaging lens 30 of FIG. 1. The lens includes a pair of focus elements 70, 71 and a rotation element 72, all of which surround a cylindrical lens bore 74. The lens has circular symmetry about an axis 75. In operation, the electron beam 18 passes through the lens generally along the axis 75, with beam deflections from the axis 75 caused by the shaping deflector 28. At least the lens bore 74 is maintained at high vacuum during operation.

The focus elements 70, 71 are spaced apart axially along the lens bore 74. The rotation element 72 is positioned axially between the focus element 70 and the focus element 71. The focus element 70 includes a magnetic outer polepiece 76 and an outer winding 77. The polepiece 76 includes opposing portions 76a, 76b surrounding the bore 74 and axially spaced apart to define an outer gap 78 around the circumference of the bore 74. The focus element 71 includes a magnetic outer polepiece 80 and an outer winding 81. The polepiece 80 includes opposing portions 80a, 80b surrounding the bore 74 and axially spaced apart to define an outer gap 82 around the circumference of the bore 74. The rotation element 72 includes a magnetic inner polepiece 84 and an inner winding 85. The polepiece 84 includes opposing portions 84a, 84b surrounding the bore 74 and axially spaced apart to define an inner gap 86 around the circumference of the bore 74. The polepieces 76, 80, 84 can have the form of hollow toroids with the respective windings positioned in the hollow interior of the toroid. The polepieces 76, 80, 84 are illustrated in simplified form in FIG. 3 as a single integral element. In a practical embodiment, the polepieces are fabricated in several pieces and then are coupled together with appropriate mounting hardware and with the windings in place to form the complete lens assembly.

The windings 77, 81, 85 comprise multiple turn electrical conductors and are operative, when energized by electrical current from a power source, to produce magnetic fields in the polepieces 76, 80, 84 and the gaps 78, 82, 86. The relative directions of the currents in the windings are indicated in FIG. 4 with "X" indicating current flow into the paper and "O" indicating current flow out of the paper. The focus element 70 can include an optional compensation winding 88 and the focus element 71 can include an optional compensation winding 89. The purpose of the optional compensation windings is described hereinafter. The lens includes means such as connectors (not shown) for connecting the windings 77, 81, 85, 88, 89 to one or more power sources.

Figure 5:
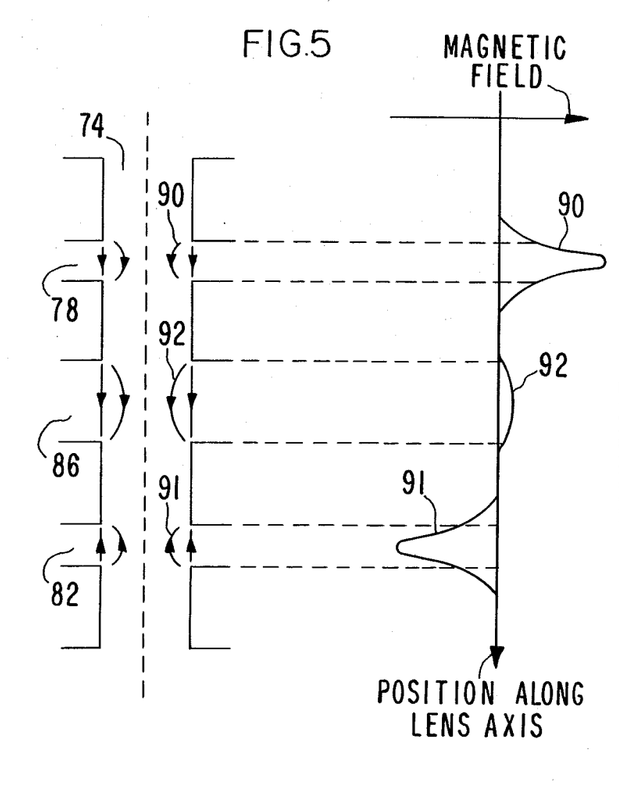
FIG. 5 illustrates the magnetic fields of the lens shown in FIG. 4.

When focus currents are applied to the outer windings 77, 81, focusing magnetic fields 90, 91 are produced in the gaps 78, 82, respectively, and in the adjacent portions of the lens bore 74, as indicated in FIG. 5. The focusing magnetic fields 90, 91 are opposite in polarity and, in a preferred embodiment, have the same magnitude and field distribution. The focusing magnetic fields 90, 91 are operative to focus the electron beam. The net rotation imparted to the electron beam by the oppositely directed magnetic fields 90, 91 is zero. When a rotation current is applied to the inner winding 85, a rotation magnetic field 92 is produced in the inner gap 86 and the adjacent portion of the lens bore 74. The rotation magnetic field 92 is operative to impart a desired rotation to the electron beam without substantially affecting focus or magnification. The rotation magnetic field 92 can have either polarity or be zero, depending upon the required rotation. The positioning of the rotation magnetic field 92 between the focusing magnetic fields 90, 91 minimizes the effect of rotational adjustments on magnification.

The operating characteristics of the magnetic lens in accordance with the present invention depend on the magnetic fields in the region traversed by the electron beam. It will be understood that the magnetic fields between the polepiece portions 76a and 76b, 80a and 80b, 84a and 84b are not confined to the gaps 78, 82, 86 but extend into the lens bore 74 where they interact with the electron beam. The fields, in turn, depend on the geometry of the gaps, the spacing between adjacent gaps, and the magnitude and polarity of the magnetic fields applied to each gap.

In order to meet the requirement that rotation adjustment not substantially affect focus or magnification, certain constraints must be placed on the magnetic fields in the gaps 78, 82, 86 both as to magnitude and spatial distribution. The magnetic fields in the vicinity of the outer gaps 78, 82 are selected to provide the desired range of focusing depending on the position of the object, the position of the image and the required magnification. The dependence of focal length on magnetic field is as follows:

$$\text{focal length} \propto 1/\int B_f^2(z)dz$$

where
  z = distance along the beam axis
  $B_f(z)$ = focusing magnetic field
Similarly, the dependence of focal length on excitation is as follows:

$$\text{focal length} \propto 1/(N_f I_f)^2$$

where
  $N_f$ = number of turns in each outer winding 77, 81
  $I_f$ = focusing current in each outer winding 77, 81
The magnetic field in the vicinity of the inner gap 86 is selected to provide the required range of beam rotation. The dependence of rotation on magnetic field is as follows:

$$\text{rotation} \propto \int B_r(z)dz$$

where $B_r(z)$ = rotation magnetic field
Similarly, the dependence of rotation on excitation is as follows:

$$\text{rotation} \propto N_r I_r$$

where
  $N_r$ = number of turns in inner winding 85
  $I_r$ = rotation current in inner winding 85 Generally, the required rotation range is small, since the apertures 24, 34 (FIG. 1) are initially mechanically aligned as closely as possible.

Since the currents in the outer windings 77, 81 are typically equal and opposite, the net resulting rotation due to the focus elements 70, 71 is zero. As the focus is varied, the currents are maintained equal so that rotation is not affected. It will be understood that the currents in the outer windings 77, 81 can differ by some fixed amount, thereby resulting in a fixed beam rotation. Beam rotation adjustments are made by varying the rotation magnetic field 92. In order to minimize the effect of beam rotation adjustments on focus, it can be seen from the expressions for focal length that $$\int B_r^2(z)dz \leq 0.01 \int B_f^2(z)dz$$

This condition can be satisfied; and the required rotation can be obtained when the magnitude of the rotation magnetic field $B_r(z)$ is relatively small and the axial interaction distance, or inner gap spacing, is relatively large. By way of example, when the inner and outer gaps have equal spacings, the above condition reduces to $$B_r \leq 0.1 B_f$$

The requirement to minimize the effect of beam rotation adjustments on focus can also be expressed as $$N_r I_r \leq 0.1 N_f I_f$$

While the inner gap 86 is illustrated in FIG. 4 as a single gap, it will be understood that the rotation magnetic field can be provided by a configuration of two or more gaps in order to tailor the magnetic field and interaction distance in accordance with the above requirements.

In general, the lens is configured to prevent more than a small amount of overlap of magnetic fields from the individual gaps and thereby keep the magnification change within prescribed limits as the beam is rotated. The performance of specific lens designs can be calculated utilizing a computer program of H. C. Chu and E. Munro, as described in Optik 61, No. 2 (1982), p. 121. Overlap of magnetic fields is reduced by keeping the gap diameters D (FIG. 4) small. However, distortion, which also affects the exposure uniformity, increases as the gap diameter is decreased, thereby setting a lower limit on the gap diameter. It is preferred that the gap diameter be in the range between 0.2 and 1.0 times the focal length of the lens. An additional factor in reducing overlap of magnetic fields is the ratio between the gap spacing S and the gap diameter D. For the outer gaps 78, 82, values of S/D in the range between 0.125 and 1.5 are satisfactory, although values in the range between 0.25 and 0.5 are preferred. With respect to the inner gap 86, S/D should have relatively large values, within the constraint of preventing or minimizing magnetic field overlap, in order to provide a large rotation range with small accompanying defocusing. For the inner gap 86, values of S/D in the range between 0.25 and 2.0 are preferred. A further factor in preventing or minimizing magnetic field overlap is the ratio of gap separation L to gap diameter D. It is preferred that L/D be in the range between 1 and 4. At the upper limit, the lens becomes impractically long. It is preferred, but not required, that the gap diameter D of each of the lens elements 70, 71, 72 be the same. This provides a cylindrical bore 74 of constant diameter and facilitates lens manufacturing. Furthermore, it is preferred, but not required, that the inner gap 86 be spaced equidistant from the outer gaps 78, 82. Finally, it is preferred, but not required, that the outer gaps 78, 82 have equal gap spacing S. As noted hereinabove, the rotation magnetic field can be provided by a configuration of two or more gaps.

Figure 6:
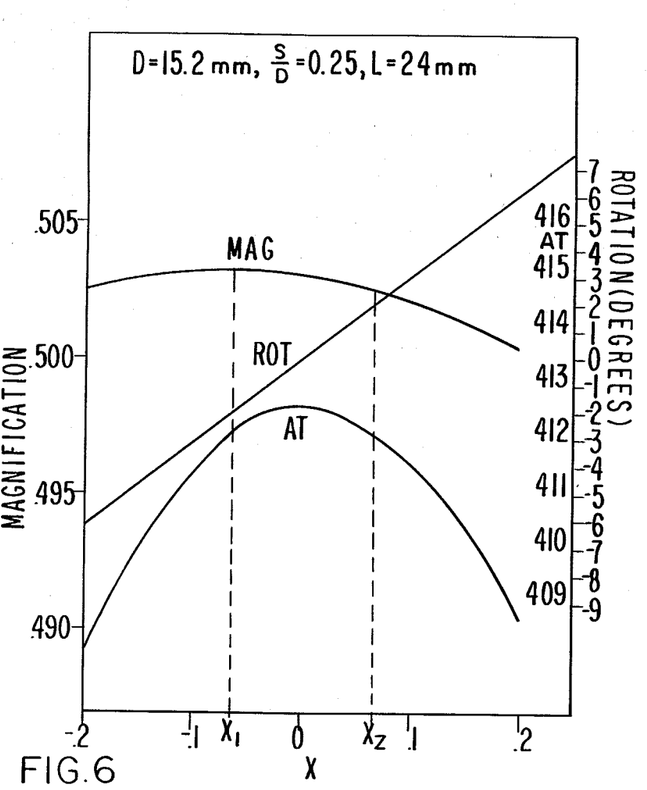
FIG. 6 is graph illustrating the performance of one embodiment of the lens of FIG. 4.

The calculated performance of one embodiment of the magnetic lens in accordance with the present invention is shown in FIG. 6. In this example D=15.2 millimeters, L=24 millimeters and S/D=0.25 for each of the gaps 78, 82, 86. In FIG. 6, lens magnification and image rotation are plotted as a function of x where x is the fractional excitation of the inner gap relative to each of the outer gaps. Also plotted in FIG. 6 is the ampere turns AT of the outer gaps necessary to maintain focus. It can be seen that for large rotational variations it is necessary to reduce the ampere turns AT in the outer gaps in order to maintain focus. However, the required range of rotation is usually limited to a few degrees and the system has a reasonably large depth of focus. When these conditions are met, the excitation of the inner gap can be kept small, and a rotational adjustment can be made without the requirement to refocus. This typical operating range is illustrated in FIG. 6 by values of x in the range between $x_1$ and $x_2$. In this range, the variation in AT, which corresponds to focus, and the variation in magnification are both minimal. The compensation windings 88, 89 are not utilized in calculating the curves of FIG. 6.

Figure 7:
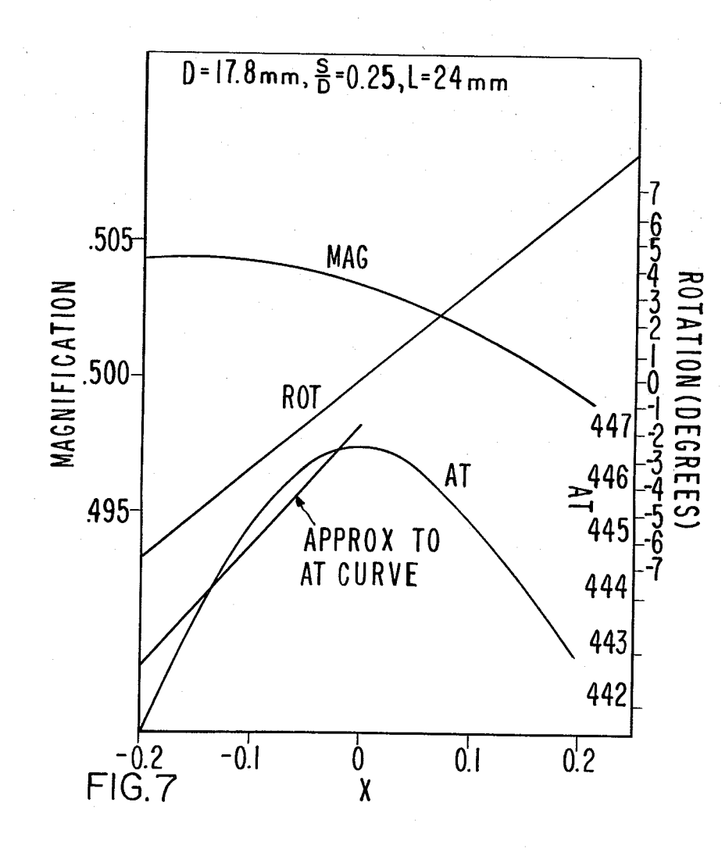
FIG. 7 is a graph illustrating the performance of another embodiment of the lens of FIG. 4.

Referring now to FIG. 7, there is illustrated the performance of another embodiment of the magnetic lens in accordance with the present invention. In this embodiment, the gap diameter D has been increased to 17.8 millimeters, thereby resulting in a small overlap between the magnetic fields in the inner gap and the magnetic fields in the outer gaps. Gap separation is 24 millimeters and the value of S/D is 0.25. The small field overlap results in a displacement of the magnification curve with respect to the ampere turn AT curve. This characteristic is utilized to provide a correction to the AT curve and, thereby, obtain a wider range of rotation adjustments while minimizing the effect on focus. The compensation windings 88, 89 are energized to reduce the effect ampere turns of the focus elements 70, 71, as the excitation of the inner gap 86 by the inner winding 85 is increased. This provides a linear approximation to a portion of the AT curve as shown in FIG. 7. In a preferred embodiment, the compensation windings 88, 89 are connected in series with the inner winding 85. The focus magnetic fields are thus decreased in proportion to the magnitude of the rotation magnetic field. Use of the compensation windings 88, 89 increases the range over which the beam can be rotated without substantially affecting the focus or magnification of the lens.

Figure 8:
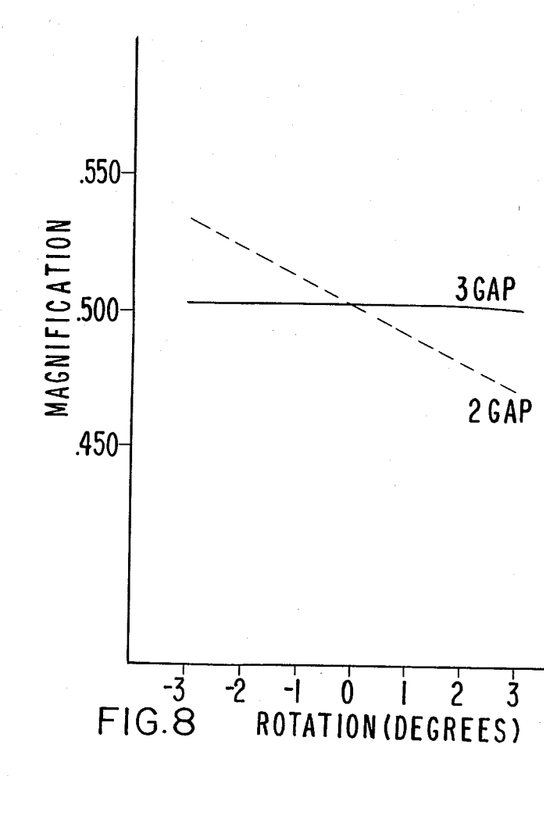
FIG. 8 is a graph illustrating lens magnification as a function of rotation.

Magnification is plotted in FIG. 8 as a function of rotation for the three gap lens in accordance with the present invention and a two gap focusing lens. In the case of the two gap lens, the rotation is obtained by increasing the current in one winding and decreasing the current in the other winding. This maintains the focus but results in an intolerable change in magnification, as shown in FIG. 8, since the asymmetrical excitation shifts the principal plane of the lens. The rotation in the three gap case is obtained by varying the magnetic field in the inner gap, while maintaining the excitation of the two outer gaps constant. As shown in FIG. 8, the magnification is nearly constant for the three gap case.

Figure 9:
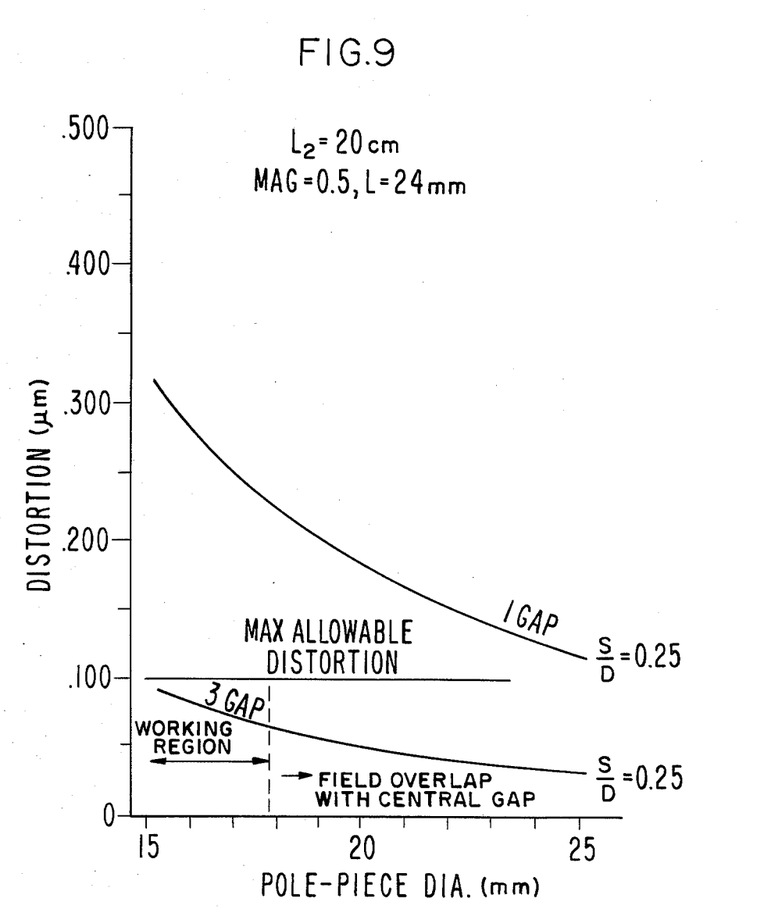
FIG. 9 is a graph illustrating lens distortion versus polepiece diameter.

The distortion of the lens in accordance with the present invention as a function of gap diameter is illustrated in FIG. 9. In calculating the distortion shown in FIG. 9, it was assumed that the spacing $L_2$ (see FIG. 1) between the first aperture 24 and the second aperture 34 was 20 cm, the required magnification was 0.5, the total deflection field at the second aperture 34 was 160 microns, the gap separation L was 24 millimeters and S/D was 0.25. A working region with acceptable distortion and acceptable field overlap is indicated. Also illustrated in FIG. 9 for comparison is the distortion associated with a one gap lens.

While there has been shown and described what is at present considered the preferred embodiments of the invention, it will be obvious to those skilled in the art that various changes and modifications may be made therein without departing from the scope of the invention as defined by the appended claims.

I claim:

1. A magnetic lens for imaging a charged particle beam, said lens comprising:
   first magnetic means for providing a first focusing magnetic field along the axis of said beam;

second magnetic means spaced along the axis of said beam from said first magnetic means for providing a second focusing magnetic field which has the opposite polarity from said first focusing magnetic field, said first and second focusing magnetic fields being operative, when varied together, to focus said beam without substantial change in beam rotation;

third magnetic means positioned along the axis of said beam between said first magnetic means and said second magnetic means, for providing a rotation magnetic field which can be varied in order to rotate said beam without substantial change in magnification or focus; and compensation means associated with said first and second magnetic means and operative to reduce said first and second focusing magnetic fields as said rotation magnetic field is increased.

2. The magnetic lens as defined in claim 1 wherein each of said magnetic means includes a magnetic polepiece surrounding a central lens bore and having portions axially spaced apart to define a gap, and a winding which energizes said polepiece and said gap in response to current received from a power source.

3. The magnetic lens as defined in claim 1 wherein $$\int B_r^2(z)dz \leq 0.01 \int B_f^2(z)dz$$

where
 $z$ = distance along said beam axis
 $B_r(z)$ = said rotation magnetic field
 $B_f(z)$ = each of said focusing magnetic fields.

4. The magnetic lens as defined in claim 3 wherein said second focusing magnetic field has substantially the same magnitude and spatial distribution as said first focusing magnetic field.

5. A magnetic lens for imaging a charged particle beam, said lens comprising:
 a pair of focus elements axially spaced along a lens bore through which said particle beam passes, each comprising an outer polepiece having opposing portions surrounding said bore and axially spaced apart to define a circumferential outer gap, and an outer winding adapted for energizing said outer polepiece and providing a focusing magnetic field in the vicinity of said outer gap in response to a focus current; and
 a rotation element positioned axially between said focus elements and comprising an inner polepiece having opposing portions surrounding said bore and axially spaced apart to define a circumferential inner gap, and an inner winding adapted for energizing said inner polepiece and providing a rotation magnetic field in the vicinity of said inner gap in response to a rotation current, each of said focus elements further including a compensation winding operative to reduce said focusing magnetic fields provided by said outer windings as said rotation magnetic field is increased.

6. The magnetic lens as defined in claim 5 wherein the focusing magnetic fields in the vicinity of said outer gaps are equal in magnitude and opposite in direction.

7. The magnetic lens as defined in claim 5 wherein said focus currents in said outer windings are equal in magnitude.

8. The magnetic lens as defined in claim 5 wherein the ratio between the axial dimension of said outer gap and the inside diameter of said outer gap is in the range between 0.125 and 1.5.

9. The magnetic lens as defined in claim 5 wherein the ratio between the axial dimension of said outer gap and the inside diameter of said outer gap is in the range between 0.25 and 0.5.

10. The magnetic lens as defined in claim 9 wherein the ratio of the spacing between the inner gap and the outer gap to the diameter of said bore is in the range between 1 and 4.

11. The magnetic lens as defined in claim 10 wherein the ratio between the axial dimension of said inner gap and the inside diameter of said inner gap is in the range between 0.25 and 2.

12. The magnetic lens as defined in claim 5 wherein $$N_r I_r \leq 0.1 N_f I_f$$

where
 $N_r$ = number of turns in said inner winding
 $I_r$ = said rotation current
 $N_f$ = number of turns in said outer winding
 $I_f$ = said focus current.

13. The magnetic lens as defined in claim 12 wherein said inner polepiece and said outer polepieces are in the form of hollow toroids and the respective windings are positioned in said hollow toroids.

14. The magnetic lens as defined in claim 5 wherein said compensation windings are coupled in series with said inner winding and reduce said focusing magnetic fields by an amount equal to said rotation magnetic field.

15. A magnetic lens for imaging a charged particle beam, said lens comprising:
 a pair of focus elements axially spaced along a lens bore through which said particle beam passes, each comprising an outer polepiece having opposing portions surrounding said bore and axially spaced apart to define a circumferential outer gap, and an outer winding adapted for energizing said outer polepiece and providing a focusing magnetic field in the vicinity of said outer gap in response to a focus current; and
 a rotation element positioned axially between said focus elements and comprising an inner polepiece having opposing portions surrounding said bore and axially spaced apart to define a circumferential inner gap, and an inner winding adapted for energizing said inner polepiece and providing a rotation magnetic field in the vicinity of said inner gap in response to a rotation current, the relative dimensions of said lens bore, said inner gap and said outer gap being selected to limit distortion of the beam while keeping the magnification change within prescribed limits as the beam is rotated by the rotation element.

16. The magnetic lens as defined in claim 15 wherein the ratio between the axial dimension of said outer gap and the inside diameter of said outer gap is in the range between 0.125 and 1.5.

17. The magnetic lens as defined in claim 15 wherein the ratio between the axial dimension of said outer gap and the inside diameter of said outer gap is in the range between 0.25 and 0.5.

18. The magnetic lens as defined in claim 17 wherein the ratio of the spacing between the inner gap and the outer gap to the diameter of said bore is in the range between 1 and 4.

19. The magnetic lens as defined in claim 18 wherein the ratio between the axial dimension of said inner gap and the inside diameter of said inner gap is in the range between 0.25 and 2.

* * * * *